United States Patent [19]
Yonehara et al.

[11] Patent Number: 5,447,117
[45] Date of Patent: Sep. 5, 1995

[54] CRYSTAL ARTICLE, METHOD FOR PRODUCING THE SAME AND SEMICONDUCTOR DEVICE UTILIZING THE SAME

[75] Inventors: Takao Yonehara; Kenji Yamagata, both of Atsugi; Yuji Nishigaki, Odawara, all of Japan

[73] Assignee: Canon Kabushiki Kaisha, Tokyo, Japan

[21] Appl. No.: 327,804

[22] Filed: Oct. 24, 1994

Related U.S. Application Data

[63] Continuation of Ser. No. 19,333, Feb. 17, 1993, abandoned, which is a continuation of Ser. No. 690,326, Apr. 26, 1991, abandoned, which is a continuation of Ser. No. 227,821, Aug. 3, 1988, abandoned.

[30] Foreign Application Priority Data

Aug. 8, 1987 [JP] Japan ................................ 62-198687
Aug. 8, 1987 [JP] Japan ................................ 62-198689

[51] Int. Cl.⁶ .............................................. C30B 1/06
[52] U.S. Cl. ............................................ 117/7; 117/8; 117/9; 117/913; 437/62; 437/83
[58] Field of Search ................ 117/7, 8, 9, 913; 437/62, 83

[56] References Cited

U.S. PATENT DOCUMENTS

| | | | |
|---|---|---|---|
| 4,657,603 | 4/1987 | Kruehler et al. | 148/175 |
| 4,670,086 | 6/1987 | Leamy | 437/83 |
| 4,902,642 | 2/1990 | Mao et al. | 437/62 |
| 5,010,033 | 4/1991 | Tokunaga et al. | 437/83 |
| 5,087,296 | 2/1992 | Kondo et al. | 437/83 |
| 5,100,691 | 3/1992 | Tokunaga et al. | 427/38 |

FOREIGN PATENT DOCUMENTS 58-69798 4/1983 Japan .

OTHER PUBLICATIONS

Jastrzebski, "SOI by CVD: Epitaxial Lateral Overgrowth (ELO) Process-Review", J. Crystal Growth, vol. 63, 1983, pp. 493–526.

*Primary Examiner*—Robert M. Kunemund
*Attorney, Agent, or Firm*—Fitzpatrick, Cella, Harper & Scinto

[57] ABSTRACT

A crystal article comprises a substrate having an insulating amorphous surface and monocrystal formed on the substrate. The monocrystal is formed by providing a primary seed in the form of a film with an area 100 $\mu m^2$ or less arranged in a desired pattern on the surface of the substrate acting as a non-nucleation surface with a small nucleation density, then subjecting the primary seed to thermal treatment to convert it to a monocrystalline seed, and subsequently subjecting the monocrystalline seed to crystal growth treatment to allow a monocrystal to grow beyond the monocrystalline seed and cover the non-nucleation surface.

52 Claims, 13 Drawing Sheets

103  101

103  101

103  101  100

103  100  101

CRYSTAL ARTICLE, METHOD FOR PRODUCING THE SAME AND SEMICONDUCTOR DEVICE UTILIZING THE SAME

This application is a continuation of application Ser. No. 08/019,333, filed Feb. 17, 1993, now abandoned, which is a continuation of application Ser. No.07/690,326, filed Apr. 26, 1991, now abandoned, which is a continuation of application Ser. No. 07/227,821, filed Aug. 3, 1988, which is now abandoned.

BACKGROUND OF THE INVENTION

1. Field of the Invention

The present invention relates to a crystal article, a method for producing the same, and a semiconductor device utilizing the same.

2. Related Background Art

Monocrystalline thin film employed in semiconductor electronic devices and optical devices has conventionally been formed by epitaxial growth on a monocrystalline substrate. It is already known that Si, Ge or GaAs can be epitaxially grown from liquid, gas or solid phase on a silicon monocrystalline substrate (silicon wafer), or a monocrystal of GaAs, GaAlAs etc. can be epitaxially grown on a monocrystalline GaAs substrate. The semiconductor thin film prepared in this manner is used for the manufacture of semiconductor devices, integrated circuits, semiconductor lasers and light-emitting devices such as LED's.

Ultra-high speed transistors utilizing two-dimensional electron gas and superlattice devices utilizing potential well, which are recently developed, have been enabled by high precision epitaxy such as molecular beam epitaxy (MBE) utilizing ultra high vacuum and metal organic chemical vapor deposition (MOCVD).

In the epitaxial growth on such monocrystalline substrate, the lattice constant and the thermal expansion coefficient have to be matched between the monocrystalline material constituting the substrate and the epitaxially grown layer. For example it is possible to epitaxially grow a monocrystalline silicon film on sapphire constituting an insulating monocrystalline substrate, but the defects in the crystal lattice at the interface due to the difference in lattice constant and the diffusion of aluminum, which is a component of sapphire, into the epitaxial layer have been drawbacks in the application for electronic devices and circuits.

The conventional method of monocrystalline thin film formation by epitaxial growth depends strongly on the substrate material. Mathews et al. investigated combinations of the substrate material and the epitaxially grown layer (J. W. Mathews, EPITAXIAL GROWTH, Academic Press. New York, 1975 ed.).

The size of the substrate is 6 inches at maximum in case of silicon wafers, and is generally smaller in case of GaAs or sapphire. Besides the cost per chip becomes higher as the monocrystalline substrate prepared by the crystal pulling method is associated with a high production cost.

Therefore, very limited kinds of substrate materials have been available in the conventional method in order to form a monocrystalline layer usable for preparing satisfactory devices.

On the other hand, three-dimensional integrated circuits, in which semiconductor devices are laminated in the perpendicular direction to the substrate for achieving higher degree of integration and higher level of functions are being actively developed. The development of large-area semiconductor devices, such as solar cells in which devices are arranged in an array on an inexpensive glass substrate and switching transistors for liquid crystal display pixels, is increasing year after year.

In these fields it is commonly required to form a semiconductor thin film on an amorphous insulator and to form thereon electronic devices such as transistors. Particularly a technology of forming monocrystalline semiconductors of high quality on an amorphous insulating material is needed.

When a thin film is deposited on an amorphous insulating substrate such as $SiO_2$, the deposited film generally assumes an amorphous or polycrystalline structure, due to the lack of long-range regularity of the substrate material. An amorphous film has short-range regularity in the order of closest atoms, but lacks regularity in the longer range. A polycrystalline film is composed of monocrystalline grains without particular crystal direction, mutually separated at high grain boundaries.

As an example, the formation of a silicon film by CVD on $SiO_2$ gives rise to an amorphous silicon film at a deposition temperature not exceeding 600° C., or a polycrystalline silicon film with grain size ranging from several hundred to several thousand Angstroms at a higher deposition temperature. However the grain size of polycrystalline silicon and the distribution thereof vary significantly according to the forming process.

There has been obtained a polycrystalline film of large grain sizes in the order of a micron to a millimeter, by fusing and solidifying an amorphous or polycrystalline film with an energy beam such as of a laser or a rod heater (Single crystal silicon on non-single-crystal insulators, Journal of crystal growth Vol.63, No. 3, October 1983, edited by G. W. Gullen).

Also there have been obtained polycrystalline films of a large grain size in the order of a micron in solid phase, by abnormal grain growth or by secondary recrystallization with surface energy (T. Yonehara et al., Mat. Kes. Soc. Symp., P.517, Vol.25, 1984/Y. Wada et al., J. Electrochemi. Soc., Vol.129, No.9, P.1999, 1979/L. Mei et al., J. Electrochemi. Soc. Vol.129, No.8, P.1791, 1982/C. V. Thomson et al., Appl. Phys. Let. 44, No.6, P.603, 1984).

The mobility of electrons, measured in a transistor formed in the thin films of above-mentioned crystal structures, is about 0.1 $cm^2$/V.sec in amorphous silicon, 1–10 $cm^2$/V.sec in polycrystalline silicon with grain size of several hundred Angstroms, and is comparable to that in monocrystalline silicon, in case of polycrystalline silicon of large grain size obtained by fusion and solidification.

These results indicate that a device formed in the monocrystalline domain in a grain and a device formed across a grain boundary differ significantly in electrical performance. More specifically, a deposition film obtained by a conventional method on an amorphous substrate has an amorphous structure or a polycrystalline structure with grain size distribution, and the device formed thereon is significantly inferior in performance to that formed in a monocrystalline layer. Consequently such a device can only be used for a simple switch device, a solar cell, a photoelectric converting device or the like.

Also the method of forming a polycrystalline thin film of large grain size by fusion and solidification requires a long time to obtain large grain size, since the amorphous or monocrystalline thin film on each wafer has to be scanned with an energy beam, thus being unsuitable for mass production and for obtaining a large area.

FIGS. 17A to 17D illustrate process steps of forming a monocrystal, wherein a crystal 20A is grown by epitaxial growth on a small monocrystalline surface 12. Then, if the growth is continued under a depositing condition which does not form nuclei on the position surface 11, the crystal 20A continues to grow without unnecessary nucleus formation and grows also in the lateral direction as indicated by 20B, 20C, thus eventually covering the deposition surface 11, as deposition or crystal growth does not take place on said deposition surface 11.

Such crystal growing phenomenon has been reported in certain research reports, but the substrate is inevitably limited since an expensive monocrystalline substrate has to be used for obtain in the monocrystal 12.

As explained in the foregoing, the conventional crystal growing methods cannot easily produce crystals suitable for three-dimensional integration of devices or crystals of a large area, so that it has not been possible to easily and inexpensively produce monocrystal or polycrystal required for obtaining devices of satisfactory characteristics.

On the other hand, the semiconductor devices, represented by p-MOS transistor, are required to achieve higher performance, particularly stabler characteristics, for example stabler mobility of positive holes.

SUMMARY OF THE INVENTION

An object of the present invention is to resolve the drawbacks of the prior technology explained above.

Another object of the present invention is to provide a crystal article not limited by the underlying substrate.

Still another object of the present invention is to provide a monocrystal article capable of providing excellent and uniform characteristics in the semiconductor device formed thereon.

Still another object of the present invention is to provide a crystal article which can be produced easily and inexpensively.

Still another object of the present invention is to provide a process capable of producing a monocrystal article provided with the above-mentioned characteristics.

Still another object of the present invention is to provide a semiconductor device which is not limited by the selection of substrate and is stable in characteristics.

Still another object of the present invention is to provide a crystal article having a substrate with a surface of low nucleation density (hereinafter called non-nucleation surface), and a monocrystal which is grown from a monocrystalline seed provided on said substrate, having a thermal history and having controlled facial orientation, and sufficiently covers and overflows said non-nucleation surface.

Still another object of the present invention is to provide a process for producing a crystal article which comprises providing a monocrystalline seed with a thermal history and with controlled surface orientation on a substrate of an amorphous material having a non-nucleation surface, and conducting a crystal growing process thereby growing said monocrystalline seed.

Still another object of the present invention is to provide a semiconductor device having active areas on a monocrystal which is grown from a monocrystalline seed having thermal history and controlled surface orientation, provided on a substrate with a non-nucleation surface of an amorphous material, and is grown over said non-nucleation surface.

BRIEF DESCRIPTION OF THE DRAWINGS

FIGS. 1A to 1H, 2A and 2B illustrate a second embodiment of the present invention, wherein FIGS. 1A to 1H are views showing process steps, while FIGS. 2A and 2B are perspective views;

FIGS. 4A to 4F, 5A and 5B illustrate a fourth embodiment of the present invention, wherein FIGS. 4A to 4F are views showing process steps, while FIGS. 5A and 5B are perspective views;

FIGS. 10A to 10C, 11A and 11B illustrate a fifth embodiment of the present invention, wherein FIGS. 10A to 10C are views showing process steps, while FIGS. 11A and 11B are perspective views;

DETAILED DESCRIPTION OF THE INVENTION

In the following there will be explained the structure of the present invention and the effect thereof.

Substrate

The substrate to be employed in the present invention is not limited in material, shape or size as long as it is provided, at the surface thereof, with a non-nucleation surface (a surface with a nucleation density lower than that at the surface of the seed).

The substrates with non-nucleation surface naturally include the cases where the surface of the substrate material itself is a non-nucleation surface, such as $SiO_2$ substrate (glass or quartz). Also a substrate with a non-nucleation surface can be obtained by depositing a film of a material forming a non-nucleation surface on a substrate material which does not have a non-nucleation surface, such as a crystalline substrate. Such substrate can be obtained, for example, by forming an NSG film, a PSG film or a thermal $SiO_2$ film on a substrate material composed of a metal, a semiconductor, a magnetic material, a piezoelectric material or an insulating material.

Figure 8:
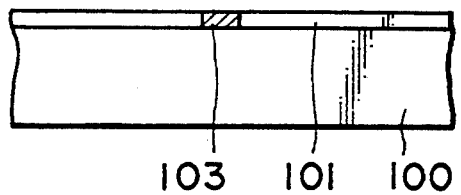
Figure 9:
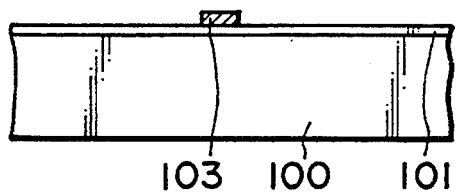

Thus the non-nucleation surface need not be composed of the surface of the substrate material itself but can be composed of the surface of a deposited film of a material same as or different from the substrate material and capable of forming a non-nucleation surface, so that the substrate may assume a structure as shown in FIG. 8 or 9.

The film forming a non-nucleation surface may be deposited for example by CVD, sputtering, LPE, MBE or any other deposition method.

Figure 10A:
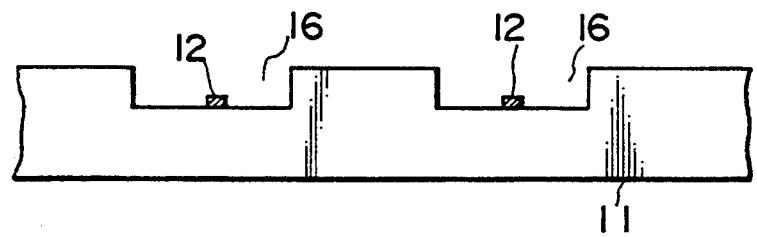
Figure 10B:
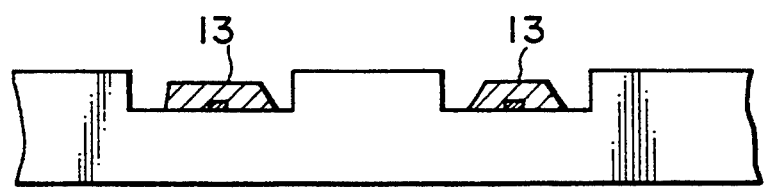
Figure 10C:
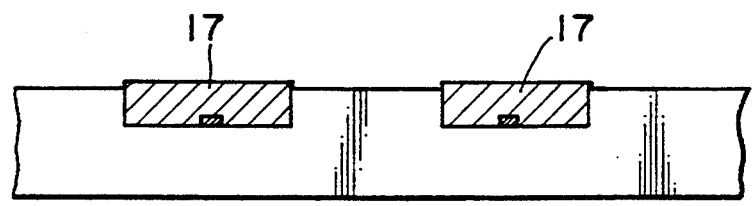

As explained before, the shape of the substrate is not limited. For example it may have a planar surface, or have a recess of a desired shape as shown in FIGS. 10A to 10C. The embodiment shown in FIGS. 10A to 10C will be explained later in detail.

The above-mentioned non-nucleation surface means a surface with a low nucleation density, which may mean an absolutely small nucleation density or a nucleation density smaller than that of the surface of the seed. The latter case is acceptable because the non-nucleation surface only needs to be free from nucleation and deposition while a monocrystal is selectively grown by epitaxial growth on the seed surface.

The nucleation density is variable by temperature, pressure, added gas (presence of etching gas such as HCl together with source gas for crystal growth retards nucleation, thereby further reducing the nucleation density on the non-nucleation surface) or other crystal growing conditions, but is preferably as low as possible under a given crystal growing condition.

Seed

A major feature of the present invention is to provide the above-explained substrate with a monocrystalline seed with controlled face orientation, as will be explained in the following.

In an investigation for reducing the fluctuation in the positive hole mobility in a p-MOS device formed in a grown monocrystal, the present inventors learned that such fluctuation may result from uncontrolled face orientation of the grown monocrystal. A further investigation on the cause of such lack of control on the orientation has lead to new information that the face orientation (preferential orientation) of the polycrystalline films on an amorphous substrate is not determined at the generation of a stable nucleus on the nucleation surface, but is probably related to the collision or unification of the nuclei generated on the nucleation surface.

Based on this information, the present inventors have made experiments for controlling the face orientation of the seed crystal, and have confirmed that said fluctuation can be eliminated by providing the non-nucleation surface of the substrate with a monocrystalline seed with controlled crystal face orientation, thereby arriving at the present invention.

Figure 1A:
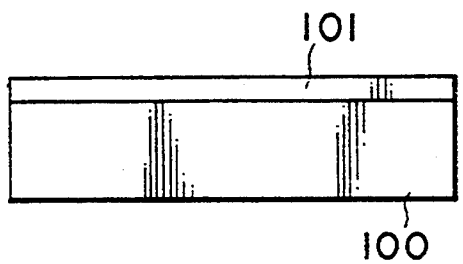
Figure 1B:
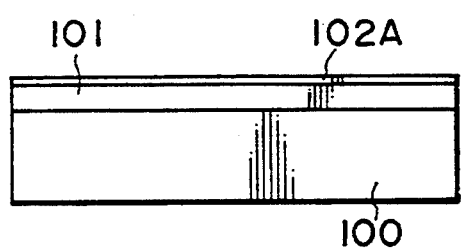
Figure 1C:
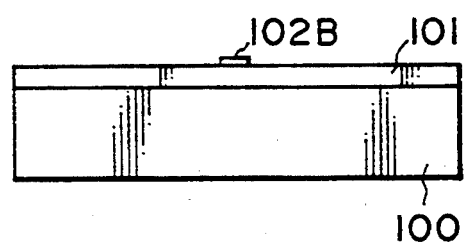
Figure 1D:
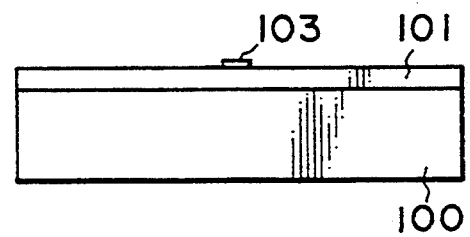
Figure 1E:
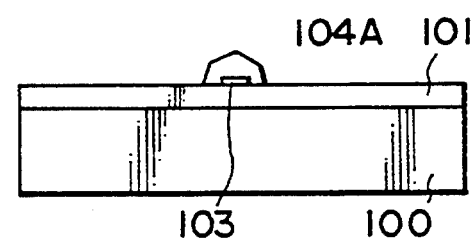
Figure 1F:
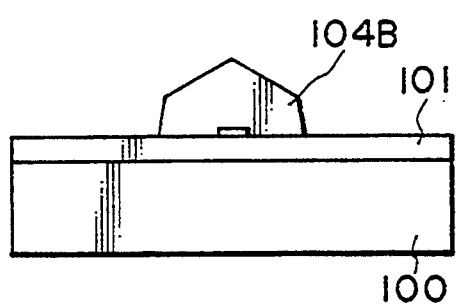
Figure 7:
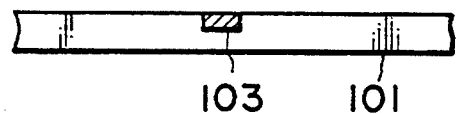

The monocrystalline seed may be provided on the surface of the substrate, as shown in FIG. 1C. It may also be provided in a recess formed on the substrate, as shown in FIG. 7 or 8. Such recess may be formed by a suitable etching method.

The substrate may be provided with a monocrystalline seed, or plural seeds. FIG. 2 shows an example of a single seed. In such case, the position of the seed substantially coincide with the center of the monocrystal to be grown therefrom.

FIG. 4 shows an example of providing plural seeds. A polycrystalline film with monocrystals of desired size and position can be obtained by selecting the distance l of the seeds equal to the size of each monocrystal to be grown, as shown in FIG. 4.

The seed can be composed, for example, Si or Ge.

Thermal History

The above-mentioned seed has a thermal history and has a controlled face orientation. A monocrystalline seed with controlled face orientation can be provided on the non-nucleation surface of the substrate, for example by forming a polycrystalline thin film of a small area with controlled face orientation on said non-nucleation surface, and then thermally treating said thin film. In this manner there is obtained a monocrystalline seed with a thermal history and with controlled face orientation. Thermal treatment of a polycrystalline thin film provides another feature, and will be explained later in the first embodiment.

The above-mentioned monocrystalline seed can also be obtained by forming an amorphous thin film of a small area on the non-nucleation surface and thermally treating said film in a similar manner as in the polycrystalline thin film.

Crystal Growing Process

According to the present invention, after the seed is provided on the non-nucleation surface of the substrate, there is conducted a crystal growing process, in which a larger monocrystal is grown from the monocrystalline seed.

The crystal growth may be conducted, for example, by CVD, LPE, MOCVD or any other suitable method.

The material of the crystal to be grown may be same as or different from the material of the seed. As an example, from a seed of Ge, there may be grown the crystal of Ge, Si or a compound semiconductor such as GaAs or GaAlAs. Also from a seed of Si, there may be similarly grown the crystal of Ge, Si or a compound semiconductor such as GaAs or GaAlAs.

In the following there will be explained the principle of crystal growth. The basic principle relies on selective epitaxial growth and epitaxial lateral growth. Before explaining the selective epitaxial growth, the general mechanism of crystal growth will be explained.

General Mechanism

If the substrate constituting the deposition surface is different from the material of incoming atoms, particularly if it is composed of an amorphous material, the incoming atoms freely diffuse on the surface of the substrate and re-evaporate therefrom. Then a nucleus is formed by the collisions of atoms, and, when it reaches a size $r_c$ where the nucleus shows a maximum change $\Delta G$ of the free energy G (such nucleus being generally called stable nucleus, growing nucleus or critical nucleus), said change $\Delta G$ starts to decrease and the nucleus continues to grow three-dimensionally, thus forming an island.

The free energy G generated by the nucleus formation is represented by:

$$G = 4\pi f(\theta) \times \{\sigma_0 r^2 + (g_v r^3)/3\}$$

$$f(\theta) = (2 - 3\cos\theta + \cos^2\theta)/4$$

wherein:
  r: radius of curvature of nucleus
  $\theta$: contact angle of nucleus
  $g_v$: free energy per unit volume
  $\sigma_0$: surface energy between nuclei and vacuum per unit area.

Figure 16:
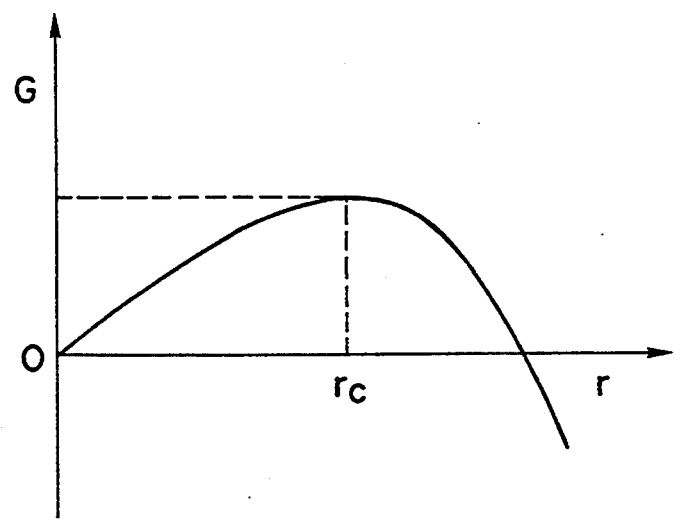
FIG. 16 is a chart showing the change in free energy of nucleation.

FIG. 16 shows the change in $\Delta G$, and a stable nucleus corresponding to the maximum value of $\Delta G$ has a radius of curvature $r_c$.

Nuclei grow in this manner to constitute islands, which further grow and mutually contact to cover the surface of the substrate in a network form, eventually covering said surface completely as a continuous film. Deposition of thin film on the substrate takes place in this manner. A satisfactory polycrystalline thin film can be obtained particularly the substrate is amorphous.

Selective Epitaxial Growth

In contrast to the ordinary crystal growth explained above, selective epitaxial growth effects epitaxial growth in a desired position on the substrate, utilizing the difference in factors influencing the nucleation during crystal growth such as surface energy, adhesion coefficient, surface diffusion rate etc. between different materials.

Thus the epitaxial growth takes place only from the surface of the seed, while the generation of stable nucleus on the substrate is prevented, so that no crystal growth occurs from the substrate.

In the present invention, since the substrate has a non-nucleation surface with low nucleation density, the generation of stable nucleus is prevented and the crystal growth takes place only from the surface of the monocrystalline seed.

According to the present invention, the crystal grows epitaxially, from the surface of the seed, upwards and laterally on the non-nucleation surface, thus eventually covering the surface of said substrate.

The absence of nucleation on the non-nucleation surface is presumably ascribable to an abnormally large surface diffusion distance or an abnormally low adsorption coefficient of the incoming atoms on the material constituting the non-nucleation surface. Also the incoming atoms may chemically react with the material of the substrate to generate a product which evaporates due to a high vapor pressure.

For example if Si is deposited on a SiO$_2$ substrate at 900° C. or higher, the deposition of Si does not take place due to the following reaction:

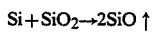

$Si + SiO_2 \rightarrow 2SiO \uparrow$ (T. Yonehara et al., J.A.P., 53, p.6829, 1982).

In case of Ge, there may occur following reaction:

$Ge + SiO_2 \rightarrow GeO \uparrow + SiO \uparrow$

Furthermore added gas may react with the adsorbed atoms, thus eventually etching off the adsorbed atoms. For example HCl gas exerts such etching for Si or Ge. Furthermore H$_2$ gas adsorbed on the SiO$_2$ substrate eliminates the adsorption sites for Si on SiO$_2$ (W. A. P. -Classen & Blaeu, J. Electro-chemical Society, 128, 1353, 1981).

Such condition of non-nucleation may be controlled by temperature, pressure, flow rate of added gases etc.

In the present invention, the monocrystalline seed has a controlled face orientation in a direction perpendicular to the substrate. It has been experimentally confirmed that selective epitaxial growth and epitaxial lateral growth from such monocrystalline seed with controlled face orientation leads to a growth monocrystal with a constant face orientation, giving rise to stable performance in a semiconductor device formed in said monocrystal.

Embodiments

In the following the present invention will be further clarified by representative embodiments thereof. (First embodiment)

In a first embodiment, a thin film is provided on a non-nucleation surface and is patterned to obtain a small primary seed, which is then thermally treated to obtain a monocrystalline seed.

In investigations for a method of providing the non-nucleation surface with a monocrystalline seed with controlled face orientation, the present inventors have found that thermal treatment, under certain conditions, of a polycrystalline thin film with controlled face orientation in a direction perpendicular to the substrate induces abnormal grain growth of the polycrystal with retained face orientation, thus generating a monocrystalline thin film of a large grain size.

The present inventors have also found that thermal treatment, under certain conditions, of an amorphous thin film generates a monocrystalline thin film of a large grain size, with controlled face orientation in a direction perpendicular to the substrate.

In an effort to define said conditions, the present inventors have confirmed that the change to monocrystal with retained face orientation depends on the area of the primary seed provided on the surface of the substrate, and that the primary seed changes to a monocrystal without grain boundary therein, while maintaining the controlled face orientation, if said area is sufficiently small.

This phenomenon, discovered by the present inventors, is presumably ascribable to an abnormal grain growth, a secondary recrystallization, or a secondary recrystallization driven by the surface energy, in a small area.

The present invention has been achieved on these findings, and a first embodiment thereof will be explained in detail in the following.

Polycrystal

A feature of the present invention lies in controlling the face orientation at the surface of a polycrystalline thin film which is to be patterned for forming a primary seed.

A desired face orientation can be obtained by selecting suitable depositing conditions in a deposition method matching the desired face orientation.

For example, for obtaining a face orientation [100] in the primary polycrystalline seed in a direction perpendicular to the substrate, the deposition may be conducted by LPCVD with a substrate temperature of 700°–800° C. Also a face orientation [110] can be obtained by deposition with LPCVD method with a substrate temperature of 600°–680° C.

A desired face orientation can naturally be obtained in other deposition methods, such as CVD under atmospheric pressure, sputtering or vacuum evaporation, by selecting suitable depositing conditions matching the desired orientation.

For obtaining a polycrystalline film instead of an amorphous film, the deposition should be carried out at a substrate temperature of 600° C. of higher for Si, or of 350° C. or higher for Ge.

The thickness of the primary seed should not exceed 1 μm, preferably 0.5 μm.

The present invention is featured by the formation of the primary seed into a small area. The small area is related to the thermal treatment, and the conversion to monocrystal is easier if the area is smaller. Said area, represented by grain size, is preferably not exceeding 10 μm, more preferably 5 μm.

Amorphous film

For the amorphous material in the present invention, there may be employed, for example, amorphous silicon or amorphous germanium deposited by low pressure CVD, plasma CVD, photo CVD, electron beam (EB) evaporation, sputtering or MBE.

The amorphous material is patterned into a small size. The thickness is not critical, but is preferably not exceeding 1 μm, more preferably 0.5 μm. The size of the patterned area should preferably not exceed 100 μm$^2$, more preferably 25 μm$^2$, still more preferably 16 μm$^2$, optimally 1 μm$^2$.

To obtain a monocrystalline seed with a face defect density of $10^5$/cm$^2$ or less to be determined by the transmission electron microscope, the size of a monocrystalline seed may preferably be 16 μm$^2$ or less, more preferably 1 μm$^2$ or less in area.

Thermal Treatment

The most significant feature of the present invention lies in thermal treatment of the small primary seed explained above, for solid-phase conversion into a monocrystalline seed with controlled face orientation in a direction perpendicular to the substrate.

The thermal treatment converts a polycrystalline primary seed of a small area with controlled face orientation, in a solid phase process, into a small monocrystalline seed with controlled face orientation.

In the thermal treatment of the polycrystalline primary seed, the preferred temperature varies depending on the material of the seed, in relation to the melting point thereof.

The thermal treatment can be conducted within a temperature range not exceeding the melting point but not lower than a temperature $Tm \times 0.4$, wherein Tm is the melting point represented in absolute temperature. The preferred temperature is variable and can be suitably selected according to the crystal state, such as presence of various crystal defects, including presence of impurities or holes.

For example, a Si polycrystalline primary seed with controlled face orientation, with a grain size of several hundred Angstroms, a thickness not exceeding 1 μm, preferably not exceeding 0.5 μm, an area not exceeding 100 μm$^2$, preferably not exceeding 25 μm$^2$, and a maximum length not exceeding 10 μm, preferably not exceeding 5 μm, is converted by termal treatment for several tens of minutes to several hours within a temperature range of 700° C. to 1300° C. into a monocrystalline seed without grain boundary therein and with controlled face orientation same as that in the polycrystalline primary seed.

The preferred temperature range of the thermal treatment varies depending on the material. For example a temperature range of 800°–1400° C. is preferred for a primary seed of polycrystalline Si, or of 600°–900° C. for a primary seed of polycrystalline Ge.

The ease of conversion of the primary seed into the monocrystalline seed is influenced by various parameters such as the material, thickness and size of the primary seed, and the temperature of thermal treatment, but the conversion to monocrystal is easier if the primary seed is thinner in thickness and smaller in size.

Addition of an element of the group III of the periodic table such as B, Al, Ge, In or Tl, or of the group V such as P, As, Sb or Bi as an impurity to the primary seed increases the mobility of atoms along the grain boundary or the frequency of atom jumps across the grain boundary, thus significantly increasing the moving speed of the grain boundary. Therefore, implantation of such impurity into the primary seed prior to the thermal treatment is preferable in inducing abnormal grain growth in the solid phase.

The thermal treatment of an amorphous primary seed is preferably conducted at a temperature hot lower than $Tm \times 0.7$, wherein Tm is the melting point represented in absolute temperature.

As an example of the material for the seed, silicon itself is not advantageous since it has a melting point of ca. 1420°–1450° C. and therefore requires a conversion temperature to monocrystal which is practically too high. For this reason silicon may be doped with an element of group V such as P or As, or of group III such as B. Doping with P with a high concentration reduces the thermal treating temperature to about 800° C. This fact enables thermal treatment of amorphous silicon in a practically acceptable process temperature range.

The amount of such doping element is preferably equal to $1 \times 10^{20}$/cm$^3$ or higher, more preferably close to the limit of solid solubility of the doping element in silicon. Said limit is different for different materials, and for different temperatures. The solid solubility limit in silicon is ca. $2 \times 10^{21}$ cm$^3$ for As, ca. $2 \times 10^{20}$ cm$^3$ for P, and ca. $4-6 \times 10^{20}$ cm$^3$ for B.

The formation of monocrystal by said thermal treatment shows a larger annealing effect (easier conversion to monocrystal) in the amorphous material than in the polycrystalline material.

(Second Embodiment)

Figure 1G:
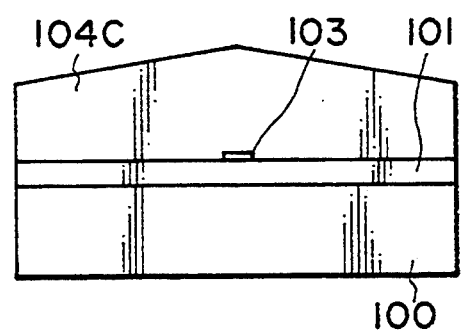
Figure 1H:
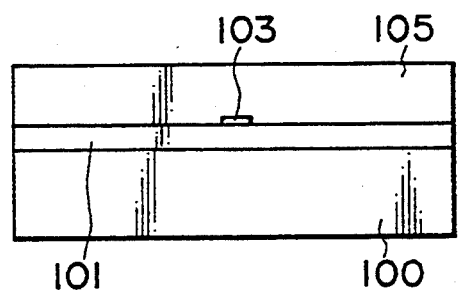
Figure 2A:
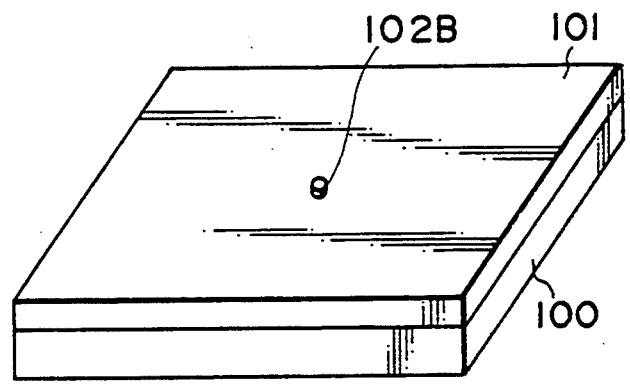
Figure 2B:
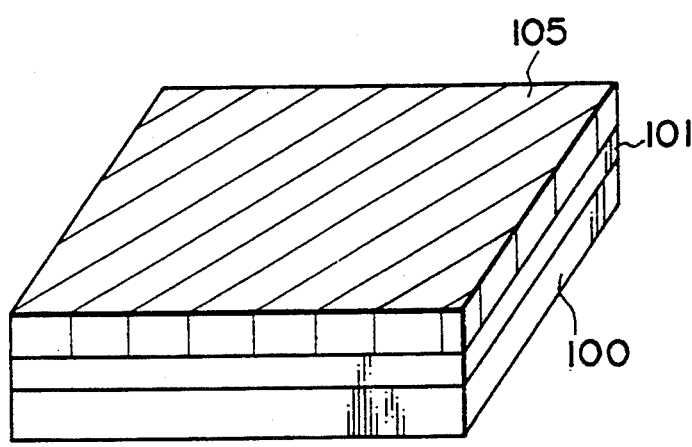

FIGS. 1A to 1H illustrate process steps of the second embodiment of the present invention, and FIGS. 2A and 2B are perspective views respectively corresponding to the steps shown in FIGS. 1C and 1H. At first, as shown in FIG. 1A, a thin film 101 with a low nucleation density is deposited on a substrate 100. Then a thin polycrystalline film 102A of face orientation controlled in a direction perpendicular to the substrate is deposited. The desired face orientation can be determined by depositing conditions. Said polycrystalline film may be replaced by an amorphous film. The thickness of said film is selected not exceeding 1 μm as explained before.

Then said film is removed, for example by etching, except for a small area, thus constituting a primary seed 102B. The size of said small primary seed is a square of 10 μm or smaller as explained before, for achieving conversion to a monocrystalline seed.

Then thermal treatment is conducted at a suitable temperature to convert the primary seed into a monocrystalline seed. In the thermal treatment of the polycrystalline primary seed, the face orientation of the polycrystalline film 102B is maintained in the monocrystalline seed 103.

Subsequently there is conducted a crystal forming process, during which gas with etching ability is preferably added in a suitable amount, in order to maintain the non-nucleation surface 101 in a state completely free from generation of stable nuclei. The crystal, being grown from the surface of the monocrystalline seed 103, form an island-shaped monocrystal 104A, 104B in which the information of face orientation is transmitted from said seed 103.

Said island-shaped monocrystal 104A, 104B grows further around the seed 103, with the monocrystalline structure and the information of face orientation transmitted from the monocrystalline seed 103, thus eventually covering the substrate 100 completely as shown in FIG. 1G.

Subsequently the monocrystal 104C is flattened by etch-polishing if necessary, to obtain a monocrystal layer 105 with controlled face orientation as shown in FIGS. 1H and 2B.

The substrate 100 can be composed of an arbitrary material. According to the present invention, the monocrystal layer 105 can be easily formed even on a substrate 100 on which functional devices have been formed by ordinary semiconductor technology.

In the above-explained embodiment, the non-nucleation surface is composed of a thin film 101, but there may naturally be employed a substrate of a material forming a non-nucleation surface, as shown in FIGS. 6 to 9.

(Third Embodiment)

Figure 3A:
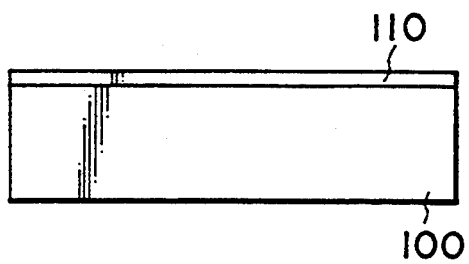
FIGS. 3A to 3G are views showing process steps of a third embodiment of the present invention.
Figure 3B:
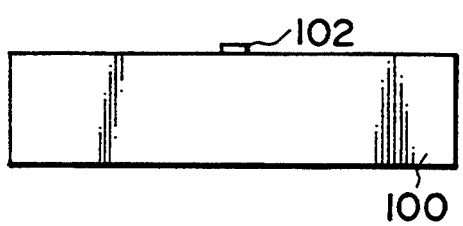
Figure 3C:
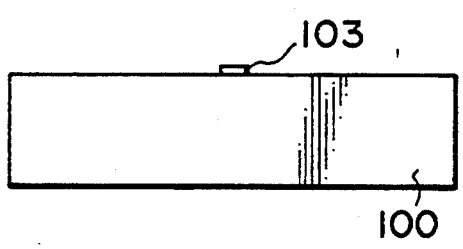
Figure 3D:
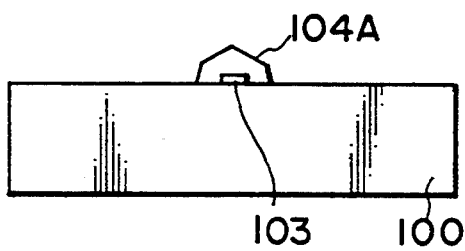
Figure 3E:
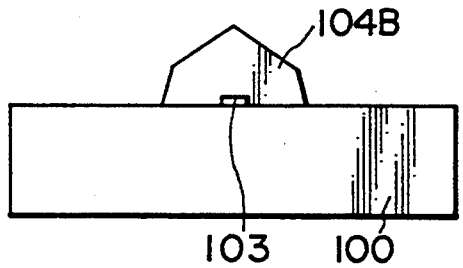
Figure 3F:
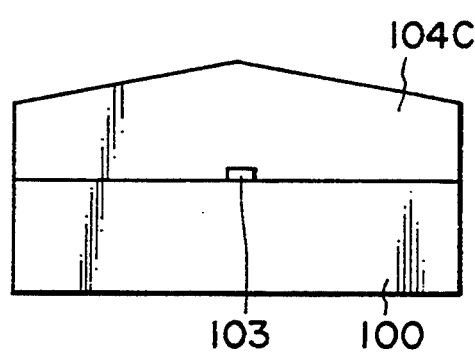
Figure 3G:
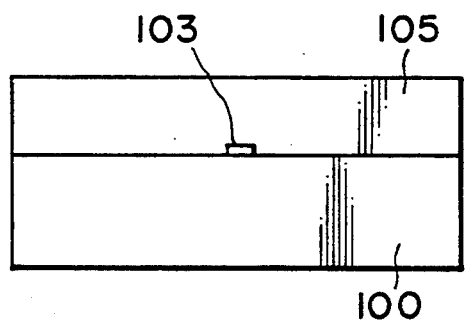

FIGS. 3A to 3G illustrate process steps of a third embodiment of the present invention. As shown in FIG. 3A, on a substrate 100 of a material of low nucleation density enabling selective epitaxial growth, there is deposited a polycrystalline or amorphous thin film 110, and a small area 102 is left by patterning with a photoresist mask. A small primary seed 102 formed on a material of low nucleation density, as shown in FIG. 3B, allows to obtain a monocrystal layer 105 in the same manner as in the first embodiment. Process steps shown in FIGS. 3B, 3C, 3D, 3E, 3F and 3G respectively correspond to those shown in FIGS. 1C, 1D, 1E, 1F, 1G and 1H.

(Fourth Embodiment)

Figure 4A:
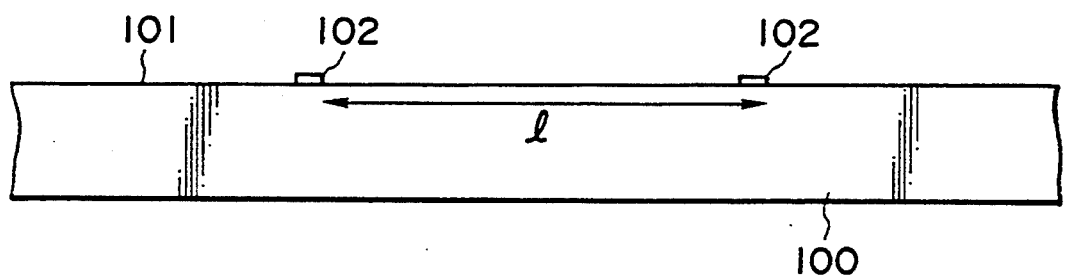
Figure 4B:
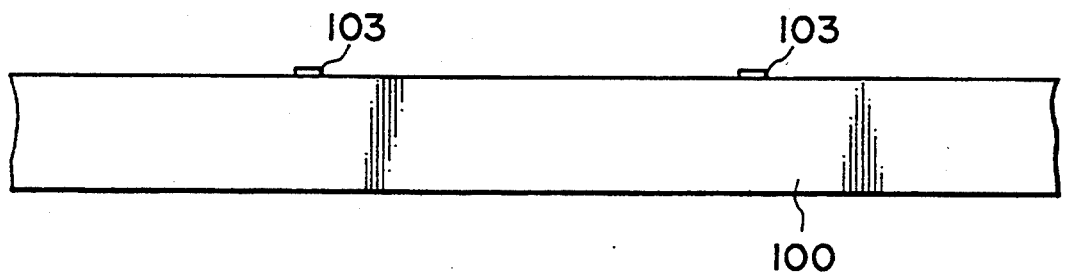
Figure 4C:
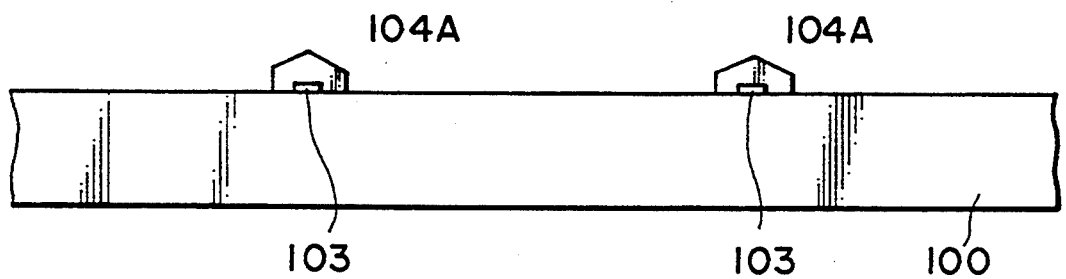
Figure 4D:
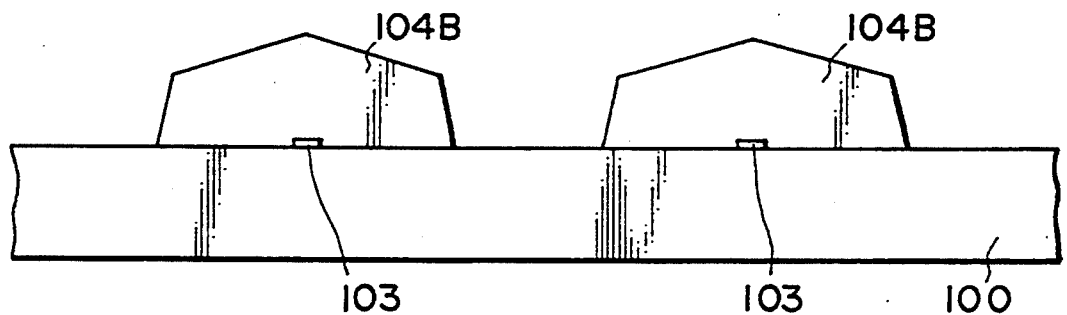
Figure 4E:
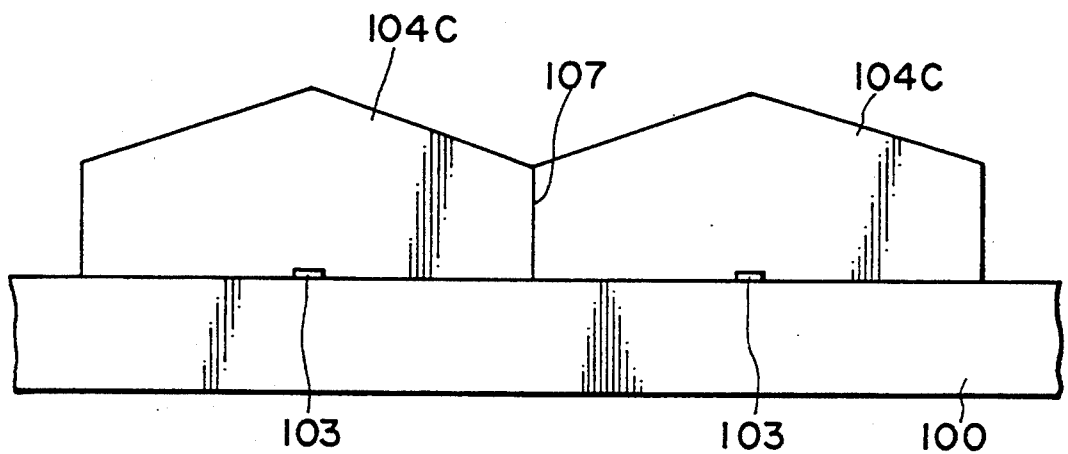
Figure 4F:
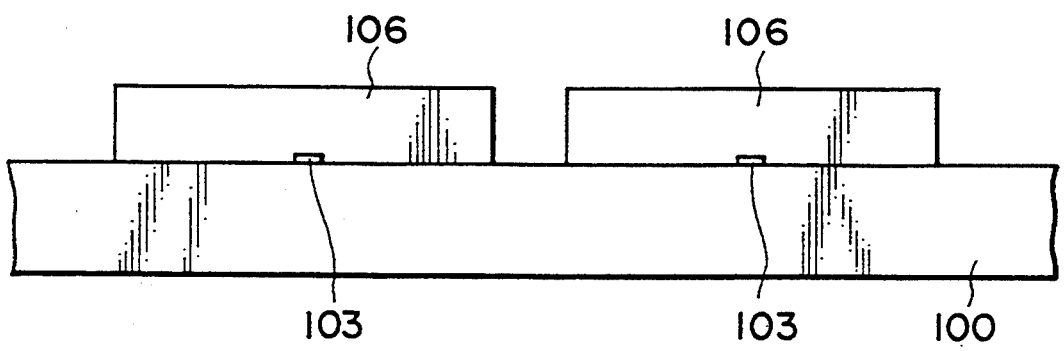
Figure 5A:
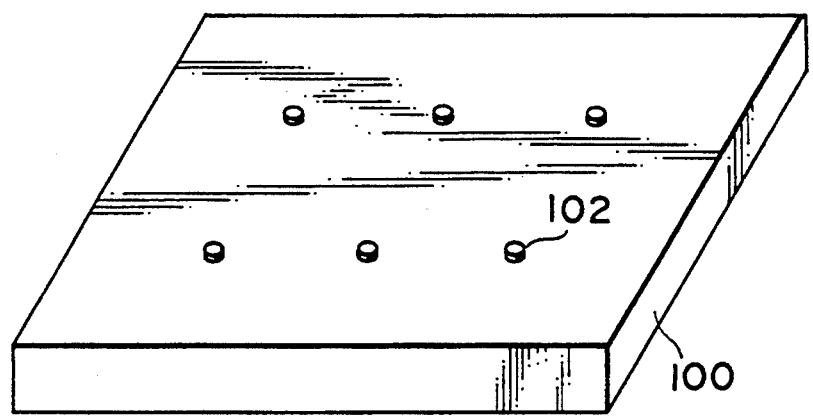
Figure 5B:
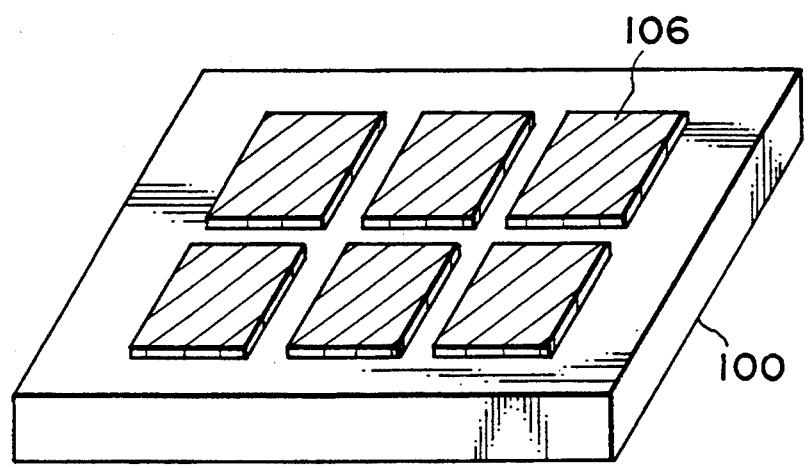
Figure 6:
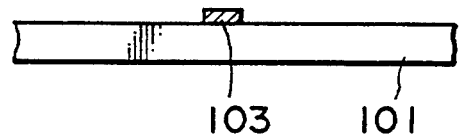
FIGS. 6 to 9 are process step views showing other embodiments of the present invention.

FIGS. 4A to 4F illustrate process steps of a fourth embodiment of the present invention, and FIGS. 5A and 5B are perspective views of the substrate corresponding to FIGS. 4A and 4F.

As shown in FIGS. 4A and 5A, primary seeds 102, composed of small polycrystalline films of controlled face orientation or amorphous films without face orientation, are formed with a distance l therebetween, on a substrate 100 of low nucleation density. Said distance l is selected equal to or larger than the size of the monocrystalline area required for forming a semiconductor device or a group of semiconductor devices therein. The primary seeds 102 can be formed in a similar manner as in the first or second embodiment.

Then thermal treatment is conducted at a suitable temperature to convert the primary seeds 102 into monocrystalline seeds 103.

If the face orientation is selected to be the same in plural polycrystalline primary seeds 102, there can be obtained monocrystalline seeds 103 of a same face orientation, as shown in FIG. 5B.

Then a crystal forming process is conducted, preferably under a condition completely free from nuclei formation on the non-nucleation surface 101. The crystals grow, by epitaxial growth, from the surfaces of monocrystals 103 to form island-shaped monocrystals 104A, 104B in which the information of face orientation is transmitted from the monocrystalline seed 103, in a similar manner as in the first or second embodiment.

The island-shaped monocrystals 104B grow further to eventually contact each other as shown in FIG. 4E, forming a crystal grain boundary 107 at the approximate center of neighboring seeds 103.

The surface of the grown monocrystals, showing facets, is flattened by polishing or etching, and the portion of grain boundary 107 is removed if necessary, to obtain monocrystalline films 106 of controlled face orientation without grain boundary, arranged in a lattice-like array, as shown in FIGS. 4F and 5B.

Even if the grain boundaries are not removed, the semiconductor devices can be positioned avoiding such boundaries since the positions thereof can be sufficiently predicted.

The size of said monocrystalline film 106 is determined, explained before, by the distance l of the seeds 103. It is therefore possible to control the positions of the grain boundaries by suitably selecting the pattern of the small polycrystalline films of controlled face orientation or of the amorphous films without face orientation, thereby obtaining monocrystals of desired size in a desired arrangement.

(Fifth Embodiment)

Figure 11A:
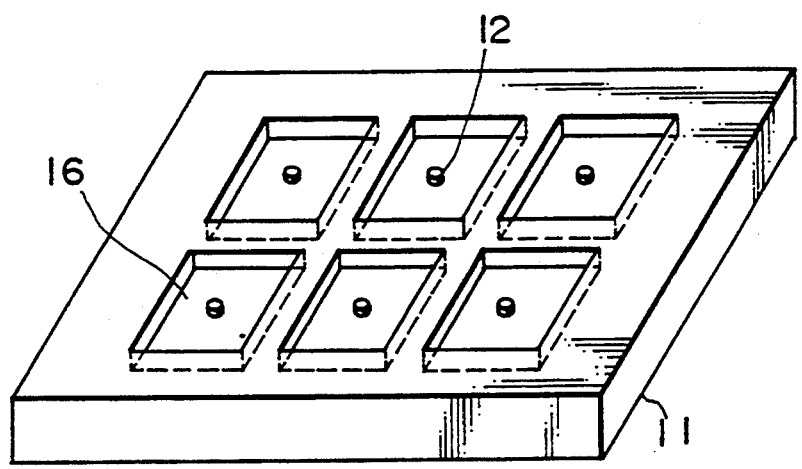
Figure 11B:
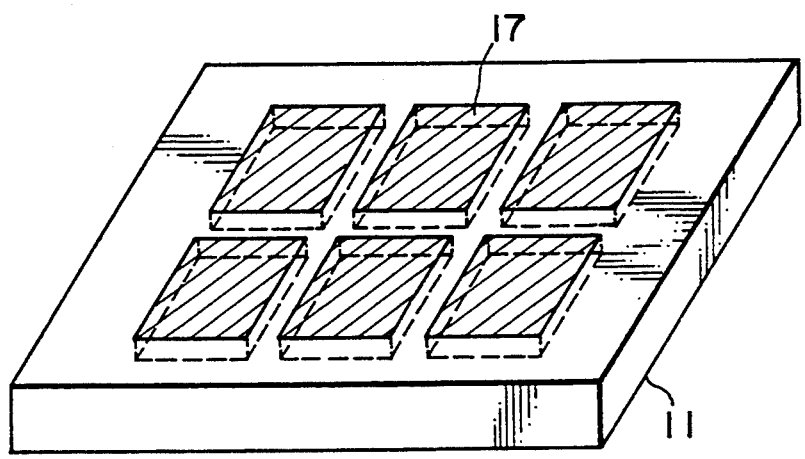

FIGS. 10A to 10C illustrate process steps of a fifth embodiment of the present invention, and FIGS. 11A and 11B are perspective views of the substrate in states corresponding to FIGS. 10A and 10C.

At first, as shown in FIGS. 10A and 11A, recesses 16 of desired shape and size are formed in an amorphous insulating substrate 11, and therein formed are primary seeds 12 of a small size composed of a polycrystalline material with controlled face orientation or an amorphous material without face orientation, which are then subjected to thermal treatment to obtain monocrystalline seeds with controlled face orientation.

Then island-shaped monocrystals 13 are formed as shown in FIG. 10B, in a similar manner as in the first embodiment.

Then the monocrystals 13 are grown until the recesses 16 are filled, as shown in FIGS. 10C and 11B, thereby forming monocrystalline layers 17.

In the present embodiment, the steps of flattening and removal of grain boundaries are not required, since the monocrystals 13 are grown in the recesses 16.

(Sixth Embodiment)

Figure 12A:
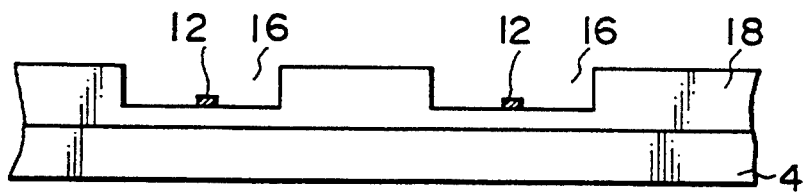
FIGS. 12A to 12C are views showing process steps of a sixth embodiment of the present invention.
Figure 12B:
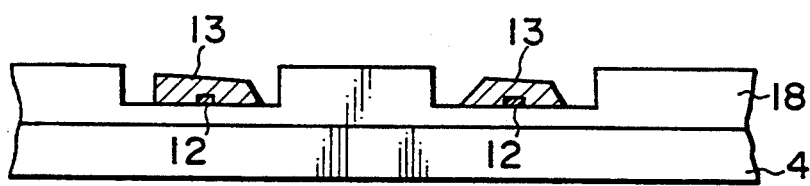
Figure 12C:
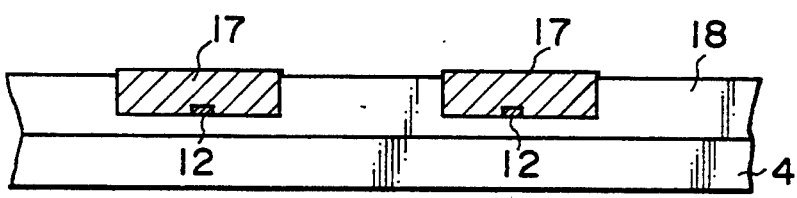

FIGS. 12A to 12C illustrate process steps of a sixth embodiment of the present invention. On an arbitrary substrate 4, there is formed a non-nucleation thin film 18 of a material of low nucleation density, and recesses 16 of desired size and shape are formed therein. Monocrystalline seeds 12 of controlled face orientation are formed in said recesses and are subjected to crystal growth.

(Seventh Embodiment)

Figure 13A:
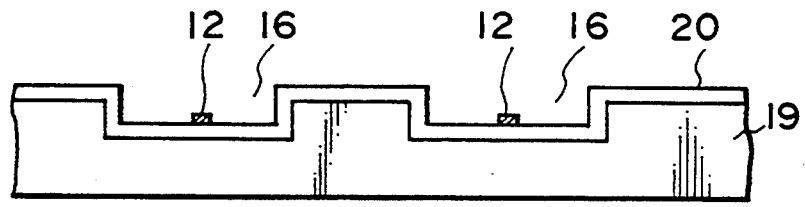
FIGS. 13A to 13C are views showing process steps of a seventh embodiment of the present invention.
Figure 13B:
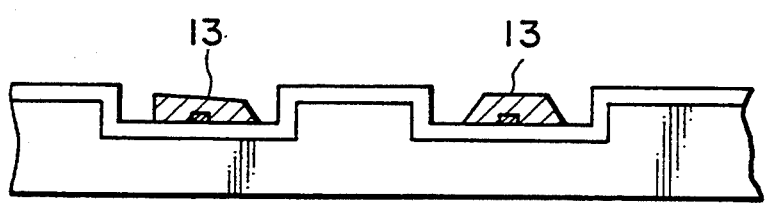
Figure 13C:
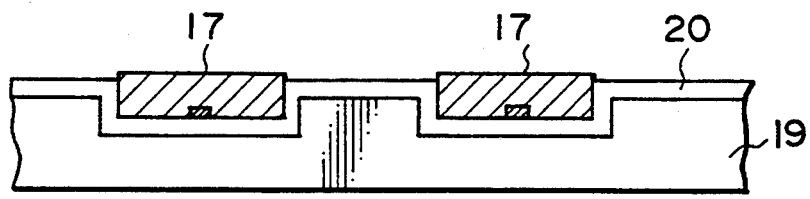

FIGS. 13A to 13C illustrate process steps of a seventh embodiment of the present invention.

After recesses 16 are formed on an arbitrary substrate 19, a nonnucleation thin film 20 of a material of low nucleation density is formed thereon. Then monocrystalline seeds 12 of controlled face orientation are formed in said recesses and are subjected to crystal growth as in the preceding embodiment.

(Eighth Embodiment)

Figure 14:
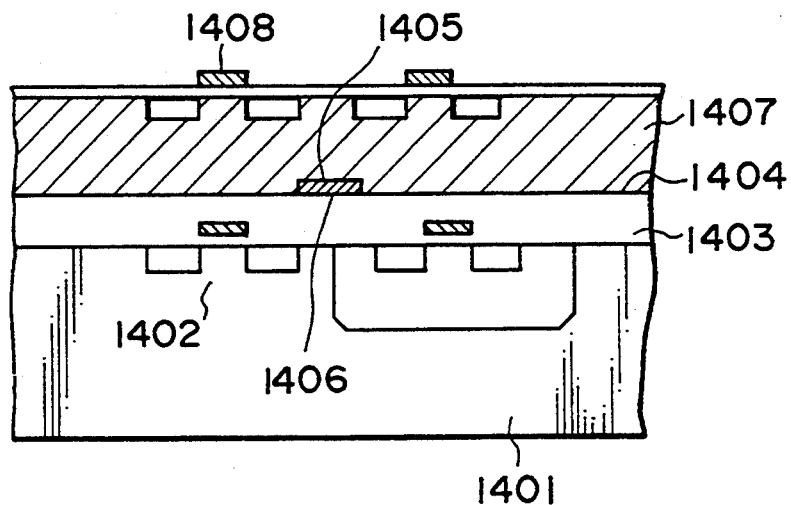
FIG. 14 is a cross-sectional view showing an eighth embodiment of the present invention.

FIG. 14 is a schematic cross-sectional view showing a semiconductor device of a multi-layered structure, produced on the structure of the embodiment shown in FIG. 1.

In FIG. 14, on a semiconductor substrate 1401 composed of Si or GaAs there is formed a transistor 1402 or other semiconductor devices or optical devices by means of an ordinary manufacturing process, and a non-nucleation surface 1403, composed for example of a SiO$_2$ layer is formed thereon by CVD method or sputtering. On said non-nucleation surface 1404 there is provided a monocrystalline seed 1405 with controlled face orientation, and is subjected to crystal growth to obtain a monocrystal 1407. Subsequently a transistor 1408 or another semiconductor device or optical device is formed in said monocrystal 1407, wherein the device formed on the substrate 1401 and that formed on the monocrystal 1407 are electrically insulated each other by the SiO$_2$ layer 1403. It is therefore rendered possible to obtain a C-MOS device without mutual interaction, by employing MOS structures in the transistor 1402 of the first layer (on the substrate 1401) and in the transistor of the second layer (on the monocrystal 1407) and overlaying said transistors on each other. It is likewise possible to integrate a light-emitting device and a driving circuit therefor, thus achieving a higher degree of integration and multiple functions.

It is further possible to form plural monocrystal layers 1407 with SiO$_2$ layers in between by repeating the above-explained process, thereby obtaining a semiconductor device of multiple-layered structure.

(Ninth Embodiment)

Figure 15A:
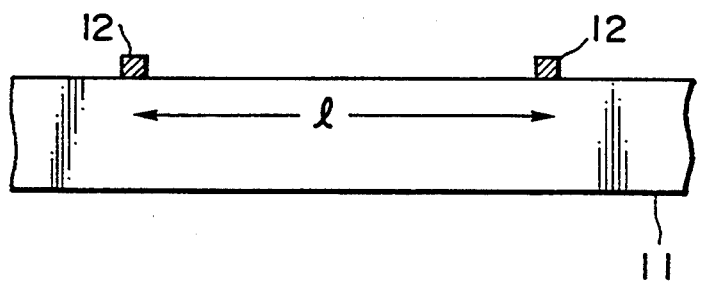
FIGS. 15A to 15D are views showing process steps of a ninth embodiment of the present invention.
Figure 15B:
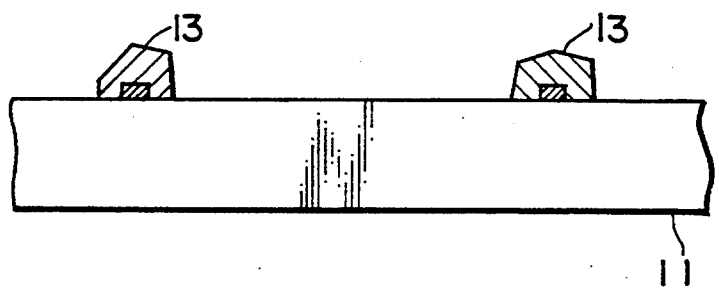
Figure 15C:
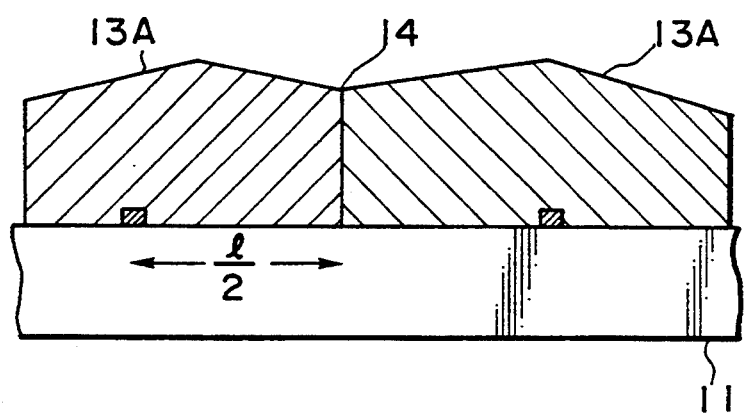

FIGS. 15A to 15C illustrate process steps of a ninth embodiment of the present invention.

Figure 15D:
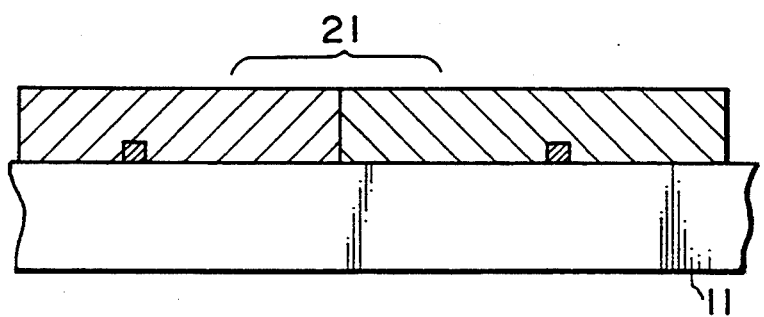
Figure 17A:
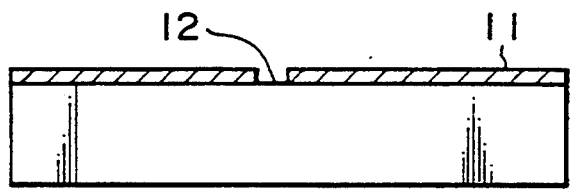
FIGS. 17A to 17D are views showing process steps of a prior technology.
Figure 17B:
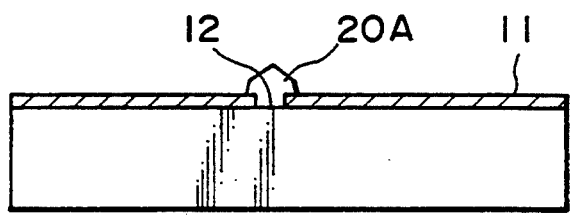
Figure 17C:
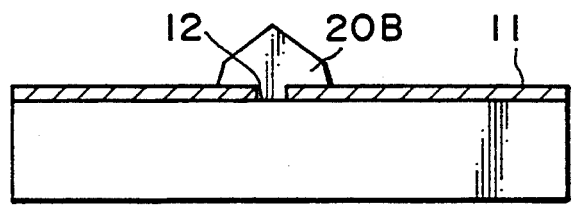
Figure 17D:
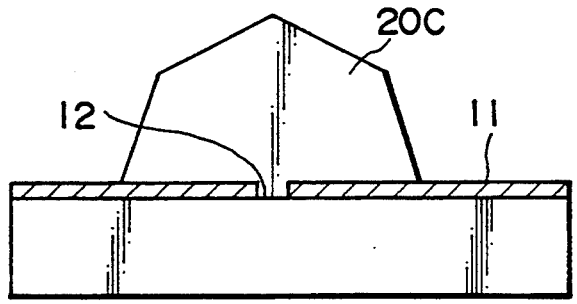

As shown in FIGS. 15A to 15C, plural monocrystalline seeds 12 of controlled face orientation (two being illustrated) are formed with a pitch l, and are subjected to epitaxial crystal growth to obtain monocrystal grains 13, which are further grown into monocrystals 13A, with grain boundaries 14 at the approximate center of the monocrystalline seeds 12. By flattening the surface of the monocrystals 13A there can be obtained, as shown in FIG. 15D, a polycrystalline layer 21 of a same face orientation and of a grain size substantially equal to l.

The grain size of said polycrystalline layer 21 can be controlled as it is determined by the pitch l of the monocrystalline seeds 12. In conventional technology, the grain size of polycrystal is variable depending on plural parameters such as forming method and forming temperature, and shows a considerably wide distribution in case of forming large grains, but, in the present embodiment, the grain size and distribution thereof can be well controlled by the pitch l of the monocrystalline seeds 12.

Examples (Example 1)

In the present example there was employed a primary seed of silicon polycrystal, and silicon monocrystal (hereinafter called crystal island) with a face orientation [110] in a direction perpendicular to the substrate was grown in gaseous phase to a size of about 80 μm in diameter.

In the following the present example will be explained in detail.

The present example employed a 4-inch silicon monocrystalline wafer as the substrate, which was subjected to thermal oxidation to form a SiO$_2$ layer of about 2000 Å in thickness, as the non-nucleation surface. On said SiO$_2$ layer there was formed a Si thin film of 500 Å in thickness, by LPCVD under following conditions:

| pressure: | 0.1 Torr |
| used gas: | SiH$_4$ (diluted with He) |
| substrate temperature: | 650° C. |

Face orientation of said Si thin film in a direction perpendicular to the substrate, determined by X-ray diffraction, was [110], and no other orientation was observed.

The grain size measurement of said Si thin film, conducted with a transmission electron microscope, proved that it was a polycrystalline thin film with a grain size of about 500 Å.

Thus obtained Si thin film was doped with phosphor with a concentration of $7.5 \times 10^{20}$ cm$^{-3}$ by phosphor glass deposition (950° C., 30 min.) caused by pyrolysis of POCl$_3$ already known in the semiconductor technology.

Subsequently a photolithographic process utilizing a stepper and reactive ion etching (RIE) utilizing SF$_6$ gas were conducted to leave small square polycrystals of 1 μm in size arranged in a matrix of 5×100 with a pitch of 100 μm and to remove unnecessary areas.

Then thermal treatment was conducted for 30 minutes in an oven of 1100° C. in an atmosphere of N$_2$ gas. Observation with a transmission electron microscope after said thermal treatment proved absence of grain boundary in said square of 1 μm.

After said observation, the Si crystal forming process by epitaxial growth was conducted, in a CVD equipment, under following conditions, to obtain a crystal article:

| pressure: | 150 Torr |
| etching gas: | HCl, 1 slm |
| carrier gas: | H$_2$, 100 slm |
| raw material gas: | SiH$_2$Cl$_2$, 0.6 slm |
| substrate temperature: | 950° C. |
| crystal forming period: | 60 minutes |

After said crystal forming process, the obtained crystal article was subjected to the observation of the grown monocrystals (crystal islands) under a metal microscope. The monocrystals showed satisfactory facets and a grain size of 80 μm, substantially without grain size distribution (fluctuation of size among crystal islands). Each of 5×100 monocrystals was grown around the position of the small polycrystalline film constituting the primary seed, and converted the SiO$_2$ film therearound over a range of 80 μm in diameter. The SiO$_2$ film outside said crystal islands did not show deposition or growth of Si monocrystals.

The face orientation, measured on 30 crystal islands randomly selected from 5×100 islands by X-ray microdiffraction with an X-ray of 30 μm in diameter, was [110] in the direction perpendicular to the substrate, in all 30 islands.

(Example 2)

In this example, Si polycrystals were employed as the primary seeds to obtain a monocrystal group with face orientation [100], and with controlled boundary position and grain size of the monocrystals, wherein the monocrystal group means a group of mutually neighboring monocrystals.

As in the example 1, a 4-inch Si monocrystalline wafer was thermally oxidized to form a $SiO_2$ film of about 2000 Å in thickness on the surface.

Then, on said $SiO_2$ film, there was formed a Si polycrystalline thin film of 500 Å in thickness constituting the primary seeds, by LPCVD under following conditions:

| | |
|---|---|
| pressure: | 1.0 Torr |
| used gas: | $SiH_4$ (diluted with He) |
| substrate temperature: | 700° C. |

The face orientation of said Si thin film, measured by X-ray diffraction, was [100] in the direction perpendicular to the substrate, and no other orientation was found. Measurement of grain size of said Si polycrystalline film as in the example 1 proved that it was a polycrystalline film of about 500 Å.

Thus obtained Si polycrystalline thin film was doped with phosphor with a concentration of $7.5 \times 10^{20}$ $cm^{-3}$ by ion implantation.

Then a photolithographic process utilizing a stepper and reactive ion etching (RIE) with $SF_6$ gas were conducted to obtain Si polycrystals of a square shape of 1 $\mu m$ arranged in a matrix of $500 \times 500$ with a pitch of 100 $\mu m$, removing the unnecessary areas.

Subsequently conducted was thermal treatment for 30 minutes in an oven with a substrate temperature of 1100° C. in an atmosphere of $N_2$ gas. Observation thereafter with a transmission electron microscope proved that the primary seed subjected to the thermal treatment was a monocrystal without grain boundary.

After said observation, a Si crystal forming process was conducted in a CVD equipment, by homogeneous epitaxial growth under following conditions:

| | |
|---|---|
| pressure: | 150 Torr |
| substrate temperature: | 950° C. |
| crystal forming period: | 90 minutes |
| raw material gas: | $SiH_2Cl_2$, 0.6 slm |
| etching gas: | HCl, 1 slm |
| carrier gas: | $H_2$, 100 slm |

After said crystal forming treatment, the crystal article was taken out of the CVD equipment and the grown monocrystals were observed under a metal microscope of a high magnification. Each Si monocrystal was grown around the original position of the primary seed arranged in lattice pattern, and was in contact with the neighboring Si monocrystals as shown in FIG. 4E. The grain size of said Si monocrystals was about 100 $\mu m$, substantially without grain size distribution.

The face orientation in the direction perpendicular to the substrate, observed with an X-ray diffraction equipment as in the example 1 on randomly selected 50 monocrystals, was [100] for all the selected monocrystals, which was same as the face orientation of the original Si polycrystalline thin film.

(Example 3)

In this example p-channel MOS-FET's (field effect transistors) were formed in a crystal group formed in a similar manner as in the example 2.

Crystals were grown in the same manner and with the same materials as in the example 2, and the monocrystal islands were planarized by lapping and polishing. Then p-channel MOS-FET's with polysilicon gates were respectively prepared, through a process ordinarily known in the semiconductor technology, in boundary-free positions of 50 monocrystal islands.

Said 50 devices showed satisfactory characteristics, and the mobility of positive holes was in a range of $180 \pm 5$ $cm^2/V.sec$ for all the devices.

(Example 4)

In this example, Ge polycrystal was employed as the primary seed, and a GaAs monocrystal with face orientation [100] in the direction perpendicular to the substrate was grown to a size of 40 $\mu m$ in diameter in gaseous phase by heterogeneous epitaxial growth.

The present example will be explained in detail in the following.

On an $Al_2O_3$ substrate of a square form of 8 cm, a $SiO_2$ layer was deposited with a thickness of 500 Å by CVD method under normal pressure with a substrate temperature of 400° C.

Then a thin Ge film of 500 Å in thickness was formed by RF sputtering under following conditions:

| | |
|---|---|
| pressure: | 3 m Torr |
| atmosphere gas: | Ar |
| power: | 50 W |
| temperature: | 600° C. |

In this manner there was formed a polycrystalline Ge thin film with orientation [100] in the direction perpendicular to the surface of the substrate.

Into this polycrystalline Ge film, P ions were implanted with a concentration of $5 \times 10^{20}$ $cm^{-3}$.

Then a photolithographic process and chemical etching with $H_2O_2:H_2O$ were conducted to leave polycrystalline Ge films of a square form of 1.2 $\mu m$ arranged in a matrix of $50 \times 100$ with a pitch of 100 $\mu m$ and to remove unnecessary areas, thereby forming primary seeds of polycrystalline Ge.

Then thermal treatment was conducted for 30 minutes at 850° C. in an atmosphere of $N_2$ gas in an oven. After the thermal treatment, observation with a transmission electron microscope on randomly selected 30 Ge crystals proved absence of grain boundary in the square of 1.2 $\mu m$.

Subsequently a crystal forming process was conducted by MOCVD under following conditions:

| | |
|---|---|
| substrate temperature: | 670° C. |
| raw material gas: | arsine ($AsH_3$), 50 SCCM |
| | trimethyl gallium (TMG), 2 SCCM |
| carrier gas: | He, 30 slm |
| process time: | 80 minutes |

After this crystal forming process, the crystals were evaluated by the above-explained analytical methods. It was thus proven that GaAs monocrystals were grown on the substrate with a respective size of 40 μm around 5x×100 positions of the primary Ge seeds.

The face orientation was [100] in the direction perpendicular to the surface of substrate, in all of randomly selected GaAs monocrystals.

Growth or deposition of GaAs was not observed on the SiO2 surface.

(Example 5)

In this example, Si polycrystals were employed as the primary seeds, and Si monocrystals with orientation [100] in the direction perpendicular to the surface of the substrate were grown in liquid phase to a size of 70 μm.

With the same materials and methods as in the example 2, there was prepared a sample, on a 4-inch silicon wafer with oxidized surface, of silicon monocrystals of face orientation [100] in the direction perpendicular to the surface of substrate, which were converted from polycrystals, arranged in a matrix of 500×500 with a pitch of 100 μm.

Said sample with monocrystalline Si seeds was immersed in solution of Si dissolved in Sn at 900° C., and crystal growth in liquid phase was conducted for 13 minutes with a cooling rate of 0.2° C. per minute.

After this crystal growing process, the obtained monocrystals were evaluated with the analytical methods mentioned above.

The monocrystals had satisfactory facets. There were obtained Si monocrystalline islands which were arranged in a matrix and had a size of 70 μm with practically no grain size distribution. No growth or deposition of Si crystals was observed in other areas of SiO2 film. The face orientation measured on tens of crystal islands was [100] in the direction perpendicular to the surface of substrate.

(Example 6)

In this example, a silicon polycrystalline film was employed as the starting seed material, and GaAs monocrystals with a face orientation [100] in the direction perpendicular to the surface of substrate were grown in liquid phase to a size of 90 μm.

In the following this example will be explained in detail.

With the same materials and methods as in the example 2, there was obtained a sample, on a 4-inch silicon wafer with oxidized surface, of silicon monocrystalline seeds, with face orientation [100] in the direction perpendicular to the surface of the substrate, converted from polycrystals and arranged in a matrix of 500×500 with a pitch of 100 μm.

Then crystal growth in liquid phase was conducted in solution of GaAs dissolved in Ga at 780° C. The growth was conducted for 15 minutes, with a cooling rate of 0.15° C./min.

The grown monocrystals showed satisfactory facets. There were obtained GaAs monocrystalline islands arranged in a matrix, with a size of 90 μm including lateral growth, and there was almost no size distribution.

No growth or deposition of GaAs was observed in other parts of SiO2 film. The face orientation was [100] in the direction perpendicular to the surface of the substrate in all of tens of crystal islands measured.

(Example 7)

In this example, Si polycrystals were employed as the primary seeds, and GaAs monocrystals with face orientation [100] in the direction perpendicular to the surface of the substrate were grown in gaseous phase to a size of 90 μm in diameter.

This example will be explained in detail in the following.

In the present example a 4-inch silicon monocrystalline wafer was employed as the substrate, and was subjected to thermal oxidation to form a SiO2 layer of ca. 2000 Å in thickness on the surface. In this example said SiO2 layer constitutes the non-nucleation surface. Then a Si thin film was formed thereon by LPCVD under following conditions:

| pressure: | 1.0 Torr |
| used gas: | SiH4 (diluted with He) |
| temperature: | 700° C. |
| film thickness: | 500 Å |

The face orientation of said Si film, measured by X-ray diffraction, was [100] in the direction perpendicular to the surface of the substrate.

Also the grain size measurement with a transmission electron microscope proved that it was a polycrystalline film of about 500 Å.

Thus obtained silicon film was doped with phosphor with a concentration of $5 \times 10^{20}$ cm$^{-3}$ by phosphor glass deposition (950° C., 30 minutes) utilizing POCl3.

Then a photolithographic process with a stepper and reactive ion etching (RIE) with SF6 gas were conducted to leave small polycrystals of a square form of 1 μm, arranged in a matrix 5×100 with a pitch of 100 μm and to remove unnecessary areas.

Then thermal treatment was conducted for 30 minutes at 1100° C. in an atmosphere of N2 gas in an oven. After said thermal treatment, observation with a transmission electron microscope proved the absence of crystal boundary in the square of 1 μm.

After said measurement, a crystal article was prepared by GaAs crystal forming process by heterogeneous epitaxial growth under following conditions in a CVD equipment:

| substrate temperature: | 670° C. |
| raw material gas: | arsine (AsH3), 50 SCCM |
| | trimethyl gallium (TMG), |
| | 2 SCCM |
| carrier gas: | N2, 30 slm |
| process time: | 80 minutes |

After the crystal formation, the crystal article was subjected to the observation of grown monocrystals under a metal microscope. The monocrystals showed satisfactory facets, and a grain size of 90 μm with almost no size distribution. The 50×100 monocrystals were formed around the positions of the primary seeds composed of polycrystalline films, and covered the surrounding SiO2 film over an area of 90 μm in diameter. No deposition or growth of GaAs monocrystals was observed in the SiO2 film outside the crystal islands.

The face orientation, measured on 30 crystal islands randomly selected from 50×100 islands, with an X-ray microdiffraction equipment with an X-ray beam of 30 μm in diameter, was [100] in the direction perpendicular to the surface of the substrate, in all the crystal islands measured.

(Example 8)

A SiO$_2$ layer 101 of 2000 Å in thickness was deposited by CVD under normal pressure, as shown in FIG. 1A, on an alumina substrate 100.

On said SiO$_2$ layer 101 there was deposited an amorphous silicon layer 102A of 1000 Å in thickness by CVD under reduced pressure, with conditions of a temperature of 560° C., a pressure o 0.3 Torr and a SiH$_4$ flow rate of 50 SCCM.

Said amorphous silicon layer 102A was completely amorphous in X-ray diffraction.

Said amorphous silicon layer 102A was doped with phosphor ions with a concentration of $7.5 \times 10^{20}$ cm$^{-3}$ by ion implantation.

The doped layer 102A was subjected to a photolithographic process and reactive ion etching for forming minute amorphous primary seeds 102B of square form of 2 μm, as shown in FIG. 1C, arranged with a pitch of 50 μm.

Then said primary seeds 102B were thermally treated for 20 minutes at 950° C. in an atmosphere of N$_2$ gas, whereby said seeds 102B were converted into monocrystalline silicon seeds 103 with face orientation [111] in the direction perpendicular to the surface of the substrate, as proven by X-ray diffraction.

Subsequently silicon monocrystals were epitaxially grown by thermal CVD under following conditions, on the substrate having SiO$_2$ layer and seeds 103:

| | |
|---|---|
| used gasses: | SiH$_2$Cl$_2$, 1.2 slm |
| | HCl, 2.0 slm |
| | H$_2$, 100 slm |
| temperature: | 1030° C. |
| pressure: | 150 Torr |
| process time: | 30 minutes |

The nucleation on the SiO$_2$ layer 101 was suppressed, and selective epitaxial crystal growth was conducted only on the monocrystalline seeds 103 as shown in FIG. 4E.

The grown monocrystals had grain boundaries at the approximate center between the monocrystalline seeds 103, and the grain size was 46 to 50 μm with little grain size distribution.

X-ray diffraction proved that the obtained monocrystals had a face orientation [111] in the direction perpendicular to the surface of the substrate.

We claim:

1. A process for producing a crystal article comprising a substrate having an insulating amorphous surface and a monocrystal formed on said substrate, which comprises preparing a substrate having a non-nucleation surface with a small nucleation density, providing a primary seed in the form of a thin polycrystalline or amorphous film with an area of 100 μm$^2$ or less arranged in a desired pattern on said substrate, then subjecting said primary seed to thermal treatment to convert it to monocrystalline seed with a controlled face orientation in a direction perpendicular to the substrate, said thermal treatment being conducted at a temperature which does not exceed the melting point Tm of the primary seed and which is not lower than 0.4×melting point when the film is polycrystalline, and not lower than 0.7×melting point when the film is amorphous, and subsequently subjecting said monocrystalline seed to crystal growth treatment to allow a monocrystal to grow beyond said monocrystalline seed and cover said non-nucleation surface.

2. A process for producing a crystal article as defined in claim 1, wherein said primary seed is a polycrystalline film having a surface with a controlled crystal face orientation and a minute area.

3. A process for producing a crystal article as defined in claim 1, wherein said monocrystalline seed is arranged plurally on said substrate.

4. A process for producing a crystal article as defined in claim 1, wherein said monocrystalline seed is arranged with regionalization on said non-nucleation surface.

5. A process for producing a crystal article as defined in claim 4, wherein said monocrystalline seed is arranged with regular regionalization on said non-nucleation surface.

6. A process for producing a crystal article as defined in claim 4, wherein said monocrystalline seed is arranged with irregular regionalization on said non-nucleation surface.

7. A process for producing a crystal article as defined in any of claims 1–3, wherein said monocrystalline seed is arranged on a planar non-nucleation surface.

8. A process for producing a crystal article as defined in any of claims 1–3, wherein said monocrystalline seed is arranged in a recess formed in said non-nucleation surface.

9. A process for producing a crystal article as defined in any of claims 1–6, wherein neighboring monocrystals growing from said monocrystalline seeds arranged plurally are in contact with each other.

10. A process for producing a crystal article as defined in any of claims 1–3, wherein neighboring monocrystals growing from said monocrystalline seeds arranged plurally are spatially departed from each other.

11. A process for producing a crystal article as defined in claim 10, wherein said monocrystalline seed is of Si or Ge.

12. A process for producing a crystal article as defined in claim 11, wherein said monocrystal is of Si, Ge, GaAs or GaAlAs.

13. A process for producing a crystal article as defined in claim 12, wherein said substrate having a non-nucleation surface is of silicon oxide, glass or quartz.

14. A process for producing a crystal article as defined in claim 13, wherein said substrate having a non-nucleation surface is of metal, semiconductor, magnetic, piezoelectric or insulator and bearing a silicon oxide, NSG or PSG film formed on the surface thereof.

15. A process for producing a crystal article as defined in claim 1, wherein said primary seed is doped with impurity.

16. A process for producing a crystal article as defined in claim 15, wherein said impurity is a Group III impurity such as B, Al, Ga, In, Tl, etc.

17. A process for producing a crystal article as defined in claim 15, wherein said impurity is a Group V impurity such as P, As, Sb, Bi, etc.

18. A process for producing a crystal article as defined in claim 17, wherein said crystal growth treatment is the CVD, LPE or MOCVD method.

19. A process for producing a crystal article as defined in claim 2, wherein said primary seed is polycrystalline Ge and the temperature of thermal treatment is 600°–900° C.

20. A process for producing a crystal article as defined in claim 2, wherein said primary seed is polycrystalline Si and the temperature of thermal treatment is 800°-1100° C.

21. A process for producing a crystal article as defined in claim 20, wherein the film thickness of said monocrystalline seed is 1 μm or less.

22. A process for producing a crystal article as defined in claim 2, wherein the film thickness of said primary seed is 1 μm or less.

23. A process for producing a crystal article as defined in claim 2, wherein the maximum length of said seed is 10 μm or less.

24. A process for producing a crystal article as defined in any of claims 1-3, wherein said substrate has a recess of a desired size and said monocrystalline seed is provided on the non-nucleation surface within said recess.

25. A process for producing a crystal article as defined in claim 24, wherein a gas for preventing the nucleation on said non-nucleation surface is supplied during crystal forming treatment.

26. A process for producing a crystal article as defined in claim 25, wherein said gas is HCl.

27. A process for producing a crystal article comprising a substrate having an insulating amorphous surface and a monocrystal formed on said substrate, which comprises preparing a substrate having a non-nucleation surface with a small nucleation density as compared with the surface of a monocrystalline seed providing a primary seed in the form of a minute polycrystalline or amorphous film with an area of 16 μm² or less arranged in a desired pattern on the surface of said substrate, then subjecting said primary seed to thermal treatment to convert it to said monocrystalline seed with a controlled face orientation in a direction perpendicular to the substrate and with a face defect density of $10^5$/cm² or less as determined by the transmission electron microscope observation, said thermal treatment being conducted at a temperature which does not exceed the melting point melting point of the primary seed and which is not lower than 0.4×melting point when the film is polycrystalline, and not lower than 0.7×melting point when the film is amorphous, and subsequently subjecting said monocrystalline seed to crystal growth treatment to allow a monocrystal to grow beyond said monocrystalline seed and cover said non-nucleation surface.

28. A process for producing a crystal article as defined in claim 27, wherein said primary seed is a polycrystalline film having a surface with a controlled crystal face orientation and a minute area.

29. A process for producing a crystal article as defined in claim 27, wherein said monocrystalline seed is arranged plurally on said substrate.

30. A process for producing a crystal article as defined in claim 27, wherein said monocrystalline seed is arranged with regionalization on said non-nucleation surface.

31. A process for producing a crystal article as defined in claim 30, wherein said monocrystalline seed is arranged with regular regionalization on said non-nucleation surface.

32. A process for producing a crystal article as defined in claim 30, wherein said monocrystalline seed is arranged with irregular regionalization on said non-nucleation surface.

33. A process for producing a crystal article as defined in any of claims 27-29, wherein said monocrystalline seed is arranged on a planar non-nucleation surface.

34. A process for producing a crystal article as defined in any of claims 27-29, wherein said monocrystalline seed is arranged in a recess formed in said non-nucleation surface.

35. A process for producing a crystal article as defined in claim 34, wherein neighboring monocrystals growing from said monocrystalline seeds arranged plurally are in contact with each other.

36. A process for producing a crystal article as defined in claim 34, wherein neighboring monocrystals growing from said monocrystalline seeds arranged plurally are spatially departed from each other.

37. A process for producing a crystal article as defined in claim 36, wherein said monocrystalline seed is of Si or Ge.

38. A process for producing a crystal article as defined in claim 37, wherein said monocrystal is of Si, Ge, GaAs or GaAlAs.

39. A process for producing a crystal article as defined in claim 38, wherein said substrate having a non-nucleation surface is of silicon oxide, glass or quartz.

40. A process for producing a crystal article as defined in claim 38, wherein said substrate having a non-nucleation surface is of metal semiconductor magnetic, piezoelectric or insulator and bearing a silicon oxide, NSG or PSG film formed on the surface thereof.

41. A process for producing a crystal article as defined in claim 27, wherein said primary seed is doped with impurity.

42. A process for producing a crystal article as defined in claim 41, wherein said impurity is a Group III impurity such as B, Al, Ga, In, Tl.

43. A process for producing a crystal article as defined in claim 41, wherein said impurity is a Group V impurity such as P, As, Sb, Bi, etc.

44. A process for producing a crystal article as defined in claim 43, wherein said crystal growth treatment is the CVD, LPE or MOCVD method.

45. A process for producing a crystal article as defined in claim 28, wherein said primary seed is polycrystalline Ge .and the temperature of thermal treatment is 600°-900° C.

46. A process for producing a crystal article as defined in claim 28, wherein said primary seed is polycrystalline Si and the temperature of thermal treatment is 800°-1100° C.

47. A process for producing a crystal article as defined in claim 46, wherein the film thickness of said monocrystalline seed is 1 μm or less.

48. A process for producing a crystal article as defined in claim 28, wherein the film thickness of said primary seed is 1 μm or less.

49. A process for producing a crystal article as defined in claim 28, wherein the maximum length of said seed is 4 μm or less.

50. A process for producing a crystal article as defined in claim 49, wherein said substrate has a recess of a desired size and said monocrystalline seed is provided on the non-nucleation surface within said recess.

51. A process for producing a crystal article as defined in claim 44, wherein a gas for preventing the nucleation on said non-nucleation surface is supplied during crystal forming treatment.

52. A process for producing a crystal article as defined in claim 51, wherein said gas is HCl.

* * * * *

UNITED STATES PATENT AND TRADEMARK OFFICE
CERTIFICATE OF CORRECTION

PATENT NO. : 5,447,117
DATED : September 5, 1995
INVENTOR(S) : TAKAO YONEHARA, ET AL.

Page 1 of 3

It is certified that error appears in the above-identified patent and that said Letters Patent is hereby corrected as shown below:

COLUMN 3

Line 10, "position" should read --deposition--.

COLUMN 5

Line 57, "coincide" should read --coincides--.

COLUMN 7

Line 5, "particularly" should read --particularly when--.
   Line 46, "following" should read --the following--.

COLUMN 8

Line 4, "thereof. (First" should read --thereof. ¶ (First--.
   Line 63, "of higher" should read --or higher--.

COLUMN 10

Line 12, "hot" should read --not--.
   Line 68, "form" should read --forms--.

COLUMN 13

Line 16, "insulated" should read --insulated from--.

COLUMN 14

Line 3, "following" should read --the following--.
   Line 38, "following" should read --the following--.
   Line 59, "converted" should read --covered--.

UNITED STATES PATENT AND TRADEMARK OFFICE
CERTIFICATE OF CORRECTION

PATENT NO. : 5,447,117
DATED : September 5, 1995
INVENTOR(S) : TAKAO YONEHARA, ET AL.

It is certified that error appears in the above-identified patent and that said Letters Patent is hereby corrected as shown below:

COLUMN 15

Line 14, "following" should read --the following--.
Line 45, "following" should read --the following--.

COLUMN 16

Line 32, "following" should read --the following--.
Line 59, "following" should read --the following--.

COLUMN 17

Line 4, "5xX100 positions" should read --50×100 positions--.
Line 6, "randomly" should read --50 randomly--.

COLUMN 18

Line 16, "following" should read --the following--.
Line 35, "matrix 5×100" should read --matrix 50×100--.
Line 44, "following" should read --the following--.

COLUMN 19

Line 30, "following" should read --the following--.
Line 64, "Tm" should be deleted.

COLUMN 21

Line 41, "melting point" (second occurrence) should be deleted.

UNITED STATES PATENT AND TRADEMARK OFFICE
CERTIFICATE OF CORRECTION

PATENT NO. : 5,447,117
DATED : September 5, 1995
INVENTOR(S) : TAKAO YONEHARA, ET AL.

Page 3 of 3

It is certified that error appears in the above-identified patent and that said Letters Patent is hereby corrected as shown below:

COLUMN 22

Line 26, "metal semiconductor" should read
           --metal, semiconductor,--.
    Line 43, ".and" should read --and--.
    Line 63, "claim 44," should read --claim 50,--.

Signed and Sealed this

Sixteenth Day of January, 1996

Attest:

BRUCE LEHMAN

Attesting Officer     Commissioner of Patents and Trademarks